United States Patent [19]
Jiang et al.

[11] Patent Number: 5,933,385
[45] Date of Patent: Aug. 3, 1999

[54] SYSTEM AND METHOD FOR A FLEXIBLE MEMORY CONTROLLER

[75] Inventors: Yong Jiang, Milpitas; Ping Lo, Sunnyvale, both of Calif.

[73] Assignee: Integrated Silicon Solution Inc., Santa Clara, Calif.

[21] Appl. No.: 08/903,720

[22] Filed: Jul. 31, 1997

[51] Int. Cl.$^6$ ..................................................... G11C 7/00
[52] U.S. Cl. .............................. 365/230.01; 365/189.01; 365/230.08; 365/239
[58] Field of Search ........................ 365/189.01, 189.04, 365/230.01, 240, 239

[56] References Cited

U.S. PATENT DOCUMENTS

| | | | |
|---|---|---|---|
| 5,487,035 | 1/1996 | Nishimura et al. | 365/189.02 |
| 5,594,700 | 1/1997 | Ward et al. | 365/230.03 |
| 5,619,453 | 4/1997 | Roohparvar et al. | 365/185.33 |
| 5,754,815 | 5/1998 | Ernst et al. | 395/405 |

FOREIGN PATENT DOCUMENTS 401305452  12/1989  Japan .

*Primary Examiner*—Viet Q. Nguyen
*Attorney, Agent, or Firm*—Flehr Hohbach Test; Albritton & Herbert LLP

[57] ABSTRACT

A flexible memory controller capable of performing any combination of read, write and deselect operations is described. The present invention can store two pending write or read operations and perform a third write or read operation. In a ZBT SRAM embodiment the memory controller has three address registers, two data registers, and two comparators. Addresses for pending memory access operations are shifted in the address registers so that memory access addresses can be stored without overwriting the memory addresses for the pending operations. Similarly, data is shifted in the data registers to ensure that data remains available for pending memory access operations. The specific register operations are controlled by a thirteen state state machine. The thirteen states and the relationships between the states are defined to enable the memory controller to perform any combination of read, write and deselect operations without inserting idle cycles. When a read address matches the address of a pending write operation it indicates that the data that the read address is intended to retrieve has not yet been written to the memory array. The data for this read operation may be in one or more places including the memory I/O pins, either of the two data registers, or inside the memory. The state machine includes a series of logical comparisons to identify the location of the desired data. After the data location is determined the data is loaded into the output register.

18 Claims, 5 Drawing Sheets

SYSTEM AND METHOD FOR A FLEXIBLE MEMORY CONTROLLER

The present invention relates generally to electronic memory devices, and particularly to controllers for semiconductor memory devices.

BACKGROUND OF THE INVENTION

Static Random Access Memories (SRAMs) are widely used high speed memory devices. The operation of SRAMs is well known and therefore is only briefly described herein. FIG. 1 illustrates a block diagram of a conventional SRAM 110. The controller 122 initiates a memory operation by asserting a chip enable signal 101 and supplying address signals A0–An (corresponding to $2^{N+1}$ memory locations) designating the address of a memory location where the operation is to be performed. If the memory operation is a write operation, the controller 122 supplies the data to be written to the addressed memory location via the bi-directional input/output lines I/O0–I/OK (corresponding to K+1 bit memory words). If the memory operation is a read operation, the stored information from the addressed location is read out from the same bi-directional input/output lines I/O0–I/OK. The memory 110 also provides connections for external power supply (VCC) and ground (GND) signals.

The heart of the memory 110 is the memory array 112, which consists of static memory cells, each capable of storing one bit of data, arranged in rows and columns. In the conventional manner, all of the cells in one row are energized for a memory operation (either a read or a write) by a word line WL uniquely associated with that row. A memory operation cannot be performed unless the word line associated with the target row of cells is activated.

At least a subset of the cells in a row (typically all of the cells that store data for one memory word) can be accessed simultaneously for a given memory operation via the bit lines BL. When the memory operation is a read, the bit lines BL are coupled to sense amplifiers in the column I/O 120 that sense the data stored in the corresponding cells of the row whose word line WL is active. When the memory operation is a write the bit lines BL carry the signals used to program the corresponding cells of the row associated with the active word line.

The control circuitry 116 controls the other blocks of the memory 110 in response to the chip enables 101. Depending on the operation to be performed, the control circuitry issues the appropriate control signals 117a, 117b to the decoder 114 and the I/O data circuit 118, respectively.

Regardless of whether the memory operation is a write or a read, the decoder 114 decodes the address signals A0–AN and activates the word line WL of the row that includes the memory word that is the target of the current memory operation.

If the operation is a write, the I/O data circuitry 118 buffers the input data signals I/O0–I/OK and outputs the buffered data to the column I/O 120 via the bidirectional data bus 119. The column I/O 120 then latches the input signals in parallel onto the corresponding bit lines BL0–BLK. The signals on the bit lines BL0–BLK are used to program the cells composing the word whose word line was activated for the current operation by the decoder 114.

If the operation is a read, sense amplifiers (SA) in the column I/O 120 sense the signals on the respective bit lines BL, convert the sensed signals into binary (e.g., high or low) voltages that represent the programmed state of the addressed word and output the word's bit values to the I/O data circuit via the bi-directional bus 119. The output data are buffered by the I/O data circuit 118 and latched onto the bi-directional data lines I/O0–I/OK for use by the controller 122.

In conventional SRAM devices the address at which a read or write operation is to be performed can arrive one or two clock cycles after the control signal initiating the write or read operation. These memory devices typically require one to two idle cycles between a read operation and a write operation. These devices cannot perform a read directly followed by a write or a write directly followed by a read. Zero bus turnaround (ZBT) SRAM's allow for write and read operations to be performed consecutively without requiring an idle cycle to switch from read to write, or from write to read.

In a conventional ZBT SRAM device there are four fixed patterns of read and write operations that the memory controller must adhere to. The first mode is a read operation followed by a write operation. The second mode is two read operations followed by two write operations. The third mode is three read operations followed by three write operations. The fourth mode is four read operations followed by four write operations. The inflexibility of requiring the controller to adhere to these four fixed modes of operation can limit memory usage.

A further drawback of conventional four mode memory devices is that if a series of read and write operations are attempted that do not adhere to one of the four pre-defined modes this can create errors which can cause a system to crash. Also conventional four mode memory devices may require an asynchronous reset to ensure that the memory device begins operation in a known state. Failure to provide the asynchronous reset can cause such memory devices to enter into an unknown state and thus require the device to be subsequently reset. For example, if the clock signal arrives before control signals are stable the device can be placed into an unknown state.

There is therefore a need for an improved memory controller to overcome these and other problems of the prior art.

SUMMARY OF THE INVENTION

In summary, the present invention is a flexible memory controller capable of performing any combination of read, write and deselect operations. One application of the present invention is in the ZBT SRAM architecture in which write data arrives at the SRAM device two cycles after the write control is asserted. In one ZBT SRAM embodiment, the memory controller has three address registers, two data registers, and two comparators. Addresses for pending memory write operations are shifted in the address registers so that new memory access addresses will not overwrite the memory addresses for the pending operations. Similarly, data is shifted in the data registers to ensure that data remains available for pending memory write operations. The specific register operations are controlled by a thirteen state state machine. The thirteen states and the relationships between the states are defined to enable the memory controller to perform any combination of read, write and deselect operations without inserting idle cycles. The states are further defined to enable the state machine to start at any of the thirteen states without requiring an asynchronous reset.

As a result of the delay between when a write control is asserted and when the data arrives in a ZBT SRAM, read addresses are checked against pending write operation addresses to determine whether there is a match. When a read address matches the address of a pending write operation it indicates that the data that the read address is intended to retrieve has not yet been written to the memory array. The data for this read operation may then be retrieved from one or more places including the memory I/O pins, either of the two data registers, or inside the memory. The state machine includes a series of logical comparisons to identify the location of the desired data. After the data location is determined the data is loaded into the output register.

The ZBT SRAM embodiment of the present invention can perform any combination of read write and deselect operations without inserting idle cycles. The controller avoids the need for logic circuitry to ensure compliance with fixed read write patterns, and the controller can start in any state of the state machine thereby avoiding the need for an asynchronous reset.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

The present invention provides an improved memory control system capable of performing any sequence of write, read and deselect operations. The flexibility of the present invention memory controller avoids the need for empty memory access cycles when the number of read operations to be performed does not match the number of write operations. For example, to perform three reads, followed by one write, followed by three reads, the present invention can perform the operations sequentially without any intervening idle cycles, in contrast to a conventional four mode ZBT memory access controller which would insert two empty read operations to make the sequence adhere to one of the four fixed memory access patterns. The present invention can therefore perform the sequence of memory access operations two clock cycles faster than a conventional four mode memory controller. The flexibility of the present invention memory controller also simplifies system hardware design by avoiding the need to design logic circuitry to ensure compliance with the four fixed memory access modes.

The present invention also avoids the need for an asynchronous reset signal typically required by conventional memory controllers. The present invention memory controller can start in any state and function properly, there is therefore no need to provide an asynchronous reset.

Figure 1:
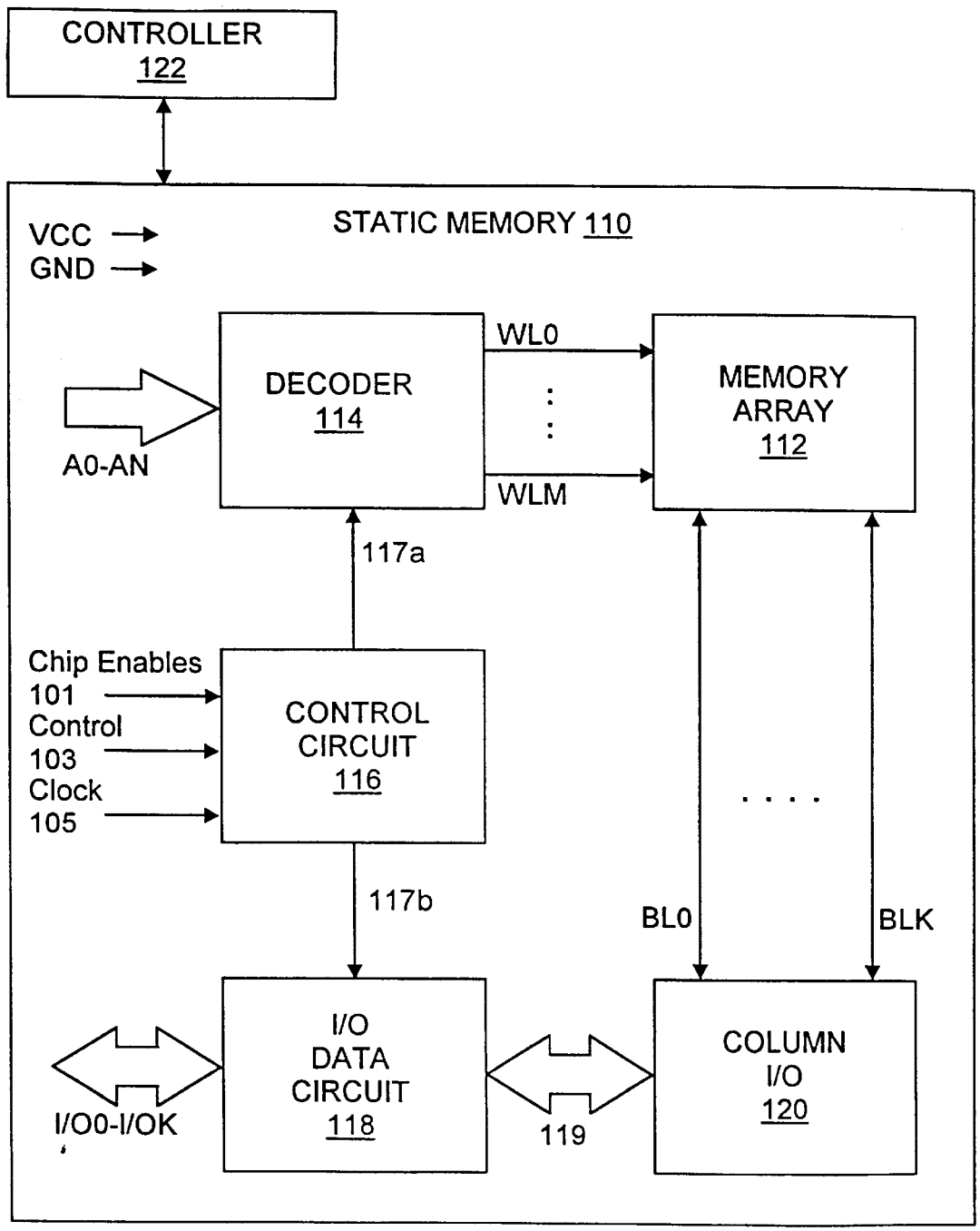
FIG. 1 is a block diagram of a conventional SRAM device.
Figure 2:
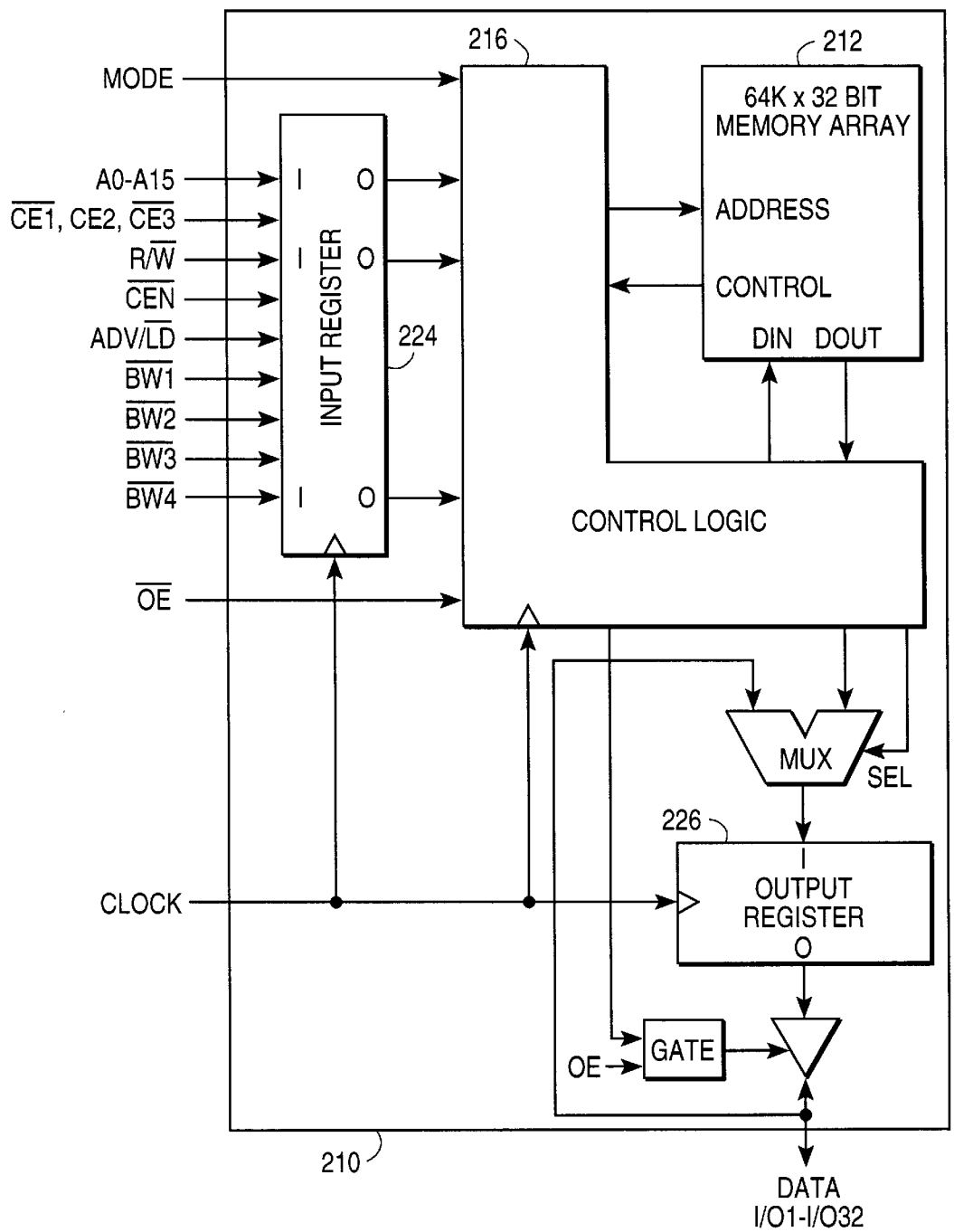
FIG. 2 is a block diagram of an SRAM device in which one embodiment of the present invention is implemented.

FIG. 2 illustrates a block diagram of an SRAM device according to one embodiment of the present invention. The input signals to the input register 224 control the operation of the SRAM. Address lines A0–A15 define the address in memory array 212 that data is to be written to or read from. Chip enable signals CE1 bar, CE2 and CE3 bar combined with the ADV/LD bar signals identify a cycle as a deselect cycle. The R/W bar control line being high indicates a read signal. A low R/W bar control line signal is a write signal. BW1 bar through BW4 bar identify what memory byte is to be written to at the word address defined by address lines A0–A15. OE bar is the output enable control signal. Data I/O lines I/O1–I/O32 are connected to a bi-directional data bus which connects the memory to the microprocessor and other system components.

Read Write and Deselect Cycles

Figure 4:
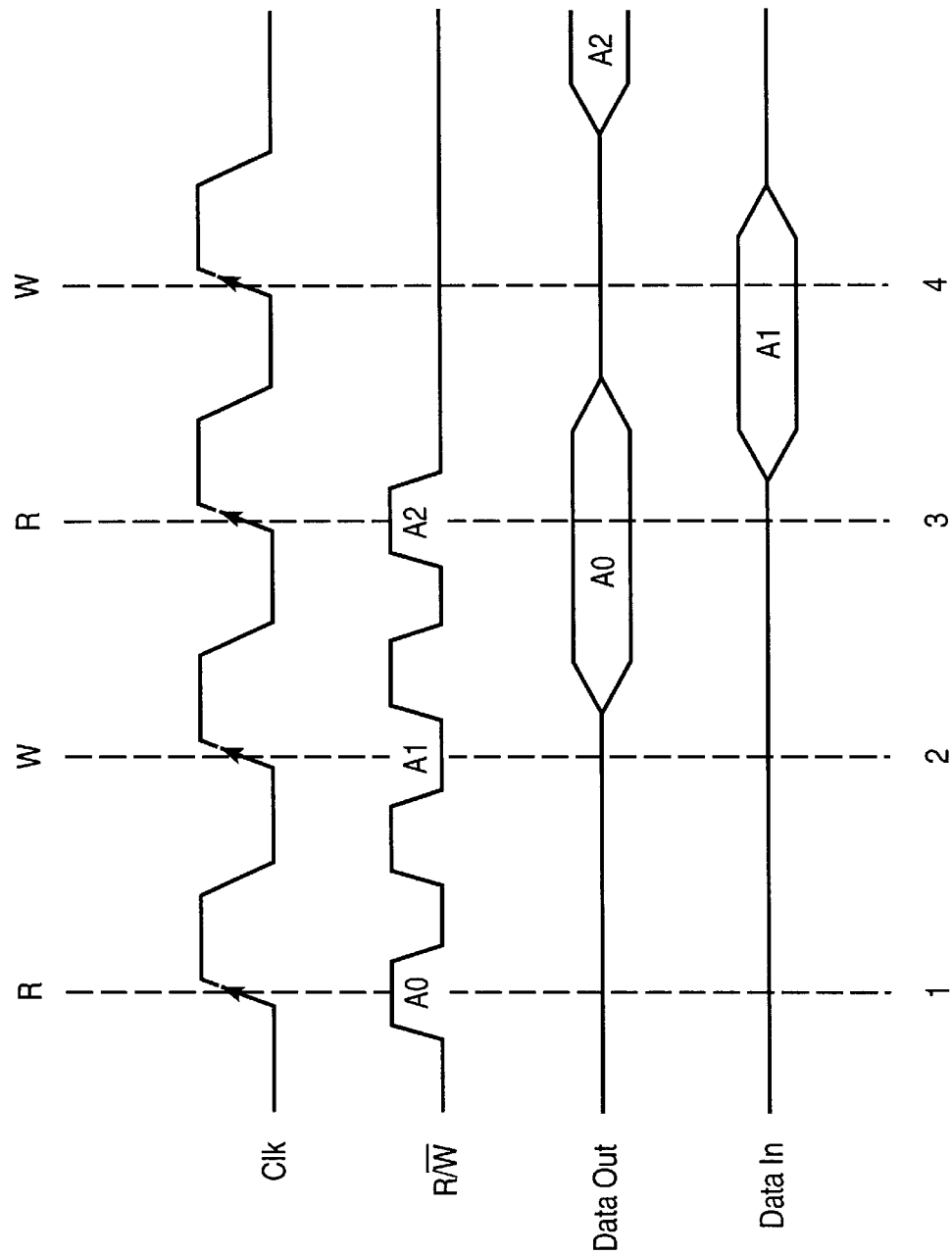
FIG. 4 is a timing diagram illustrating a read and a write operation.

FIG. 4 illustrates a read operation and a write operation according to one embodiment of the present invention. In this embodiment for a read operation, data is provided at the I/O pins two cycles after the read cycle is initiated by the control signal R/W bar. Similarly, for a write cycle write data is presented to the memory array two cycles after the write cycle is initiated by the control signal R/W bar. These relationships are defined in the industry standard specification for zero bus turnaround (ZBT) SRAMs. At the rising edge of clock cycle 1 control line R/W bar is high indicating a read cycle. At the block diagram level of FIG. 2, the read address is read from address lines A0–A15. The data located at the address defined by A0–A15 is then read. At clock cycle 2 control line R/W bar is low indicating a write cycle. At clock cycle 2 the data AO from the first read operation is latched at the I/O lines I/O1–I/O32. Thus the data is not available until two cycles after the control line is asserted. At clock cycle three the R/W bar control line is high which indicates a second read operation. At clock cycle 4 the data from the write cycle initiated at clock cycle 2 is read from the data I/O lines I/O1–I/O32. Thus here the data for the write cycle is not read from the bus until two cycles after the initial write control signal is received. With the flexible memory controller of the present invention, the number of write cycles that a memory operation remains pending depends on the state of the memory controller and the type of memory operations performed after the pending operation is initiated. For example, a write operation may remain pending for numerous cycles if it is followed by an uninterrupted series of read operations.

Figure 3:
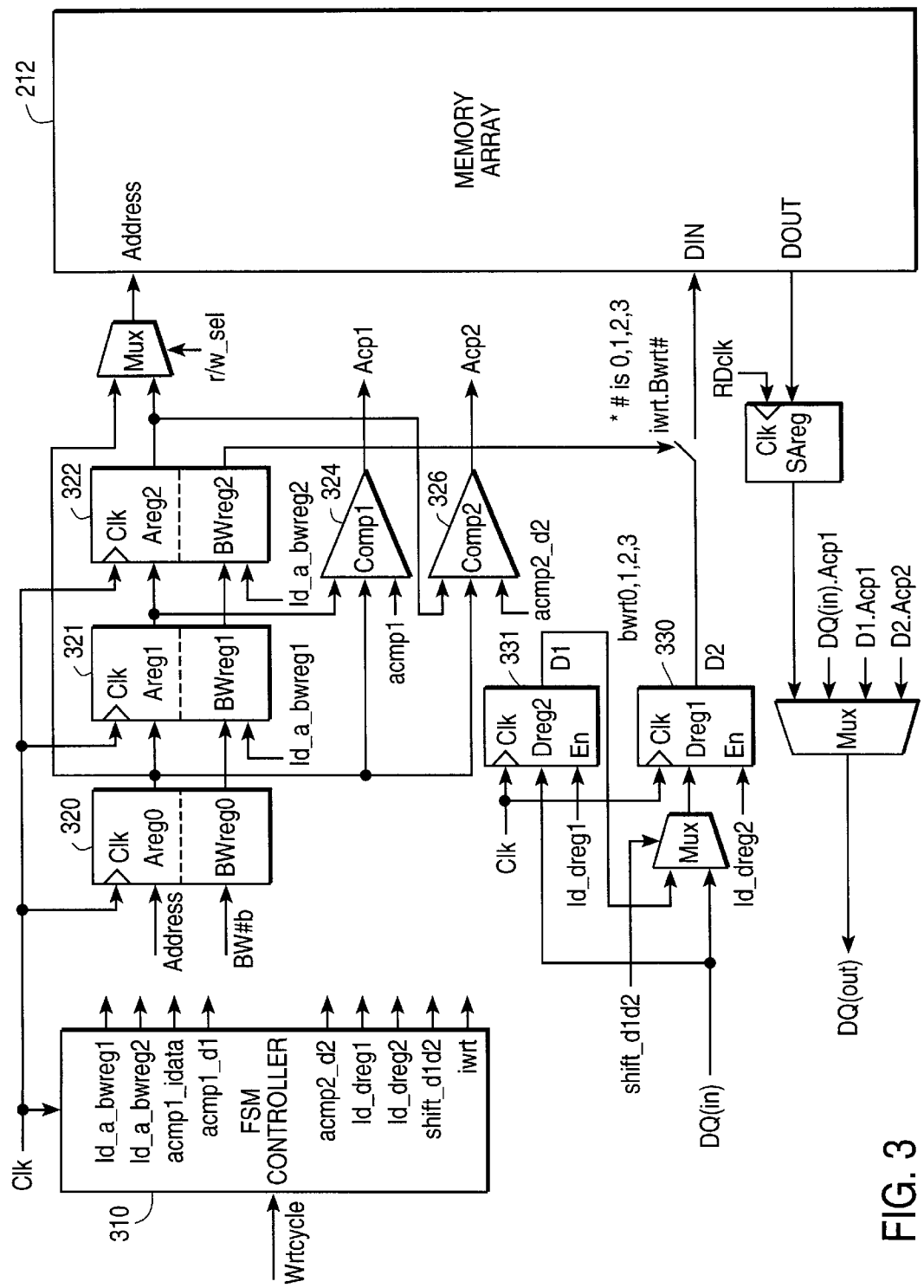
FIG. 3 is a logic diagram of a memory controller.

Because data corresponding to a write operation may not arrive until after a write control signal is asserted, read addresses are compared with pending write addresses to ensure the right data is retrieved. To better understand this situation it is necessary to review the logic diagram illustrated in FIG. 3 which is a more detailed diagram of the control logic block 216 in FIG. 2. Address registers areg0 320, areg1 321 and areg2 322 store the memory addresses received from address lines A0–A15 pending completion of the corresponding read or write operation. For write operations data registers dreg1 330 and dreg2 331 store the data received from the data bus before the data is written to memory array 212. For read operations read data registers, not shown, store the data read from memory array 212 before it is latched into the I/O data bus lines. In a write operation address lines A0–A15 define the 32 bit word location in memory array 212 that is to be written to. Byte write registers bwreg1, bwreg2, bwreg3 and bwreg4 define what byte within that word each byte of data is to be written to. Therefore, if a write cycle is initiated but none of the byte write signals are selected then no memory bytes are written. The write address is initially stored in address register 0. In subsequent clock cycles, the state machine transfers the write address from address register 0 to address register 1 and then to address register 2. When the memory array is accessed to complete a write operation the memory address is obtained from address register 2 and the data is taken from data register 2.

In addition to read and write cycles there are also deselect cycles. The memory device still receives the clock and control signals in a deselect cycle, therefore the state of the device advances to the next state and internal registers may be changed in the process. In contrast when the clock enable control pin CEN bar, illustrated in FIG. 2, is high before a rising edge of the clock, that clock edge is blocked from propagating through the memory device. The state of all the internal registers remain fixed when CEN bar is high.

Because of the two cycle delay between the initiation of a read or write cycle and the availability of the data to complete the operation, if one or more write operations are initiated directly followed by a read operation at the same address in memory, then the data for the read operation may not be available from the memory array when the controller requests it. To detect situations where read data is not available in the memory array, the read address is compared to the preceding write address. This comparison is performed by comparators comp1 324 and comp2 326. If the read address matches the preceding write address then the location of the data to be read is determined. The data to be read may be on the data bus or it may be in data register dreg1 330 and/or dreg2 331. The location of the data depends upon the state of the memory device. The location of data in different memory states is clarified in the description of the state diagram illustrated in FIG. 5.

The following example illustrates the operation of a case where data to be read has not yet been written to the memory array and therefore must be read from another source. At a first clock cycle a write to byte 1 of address 0 is initiated as defined by address lines A0–A15 and byte write register 1 being high. At a second clock cycle a write to byte 2 of address 0 is initiated, at this point there are two write operations pending. At a third clock cycle a read operation of address 0 is initiated. Here the address for the read and the preceding writes all match because they are all accessing address location 0. The location of the data for the first and second write operations depends on the state of the memory device. In this example, when the read operation is performed the data for the first write operation may be in data register dreg1 330. The data from the second read operation may still be on the I/O data bus lines. Therefore, if all four bytes of address 0 are read from the memory array the byte 1 and byte 2 data will be the old invalid data and not the new data that was requested. In this example, the byte 1 data is read from dreg1 330, the byte 2 data is read from the I/O lines, and the byte 3 and 4 data are read from bytes 3 and 4 of address 0 of the memory array. Bytes 3 and 4 of address 0 in the memory array are valid data because the preceding two write operations were only directed at bytes 1 and 2 of address 0. Because a write operation may remain pending for any number of cycles where it is followed by a continuous series of read or deselect operations, while the write operation is pending the data is kept available by being stored in one or both of the data registers. The specific operations associated with such a situation are described below in relation to the state machine illustrated FIG. 5.

The memory controller can be viewed as a three stage pipeline machine. The first stage and the second stage are essentially the decode stage and the third stage performs the operation. The first and the second stage can each contain a pending write operation. The third stage of the pipeline can be performing either a read or a write operation. Thus the present invention can process two pending write operations.

The pipeline model is made more complicated by the fact that in one embodiment data for a corresponding write or read operation may not be available until two or more cycles after the write or read operation is initiated. Thus the three stage pipeline model is more directly applicable to the processing of the read and write control signals. The state machine description provides a more detailed description of the relationship between the control signals and the data flow.

The first two address registers are used to store the write addresses for two pending write operations. The third address register areg0 320 can be used to store the address for either a read or a write operation. The number of pipeline stages required depends in part on the number of cycles after a control signal is asserted that the data to perform the requested operation becomes available. In one ZBT SRAM embodiment of the present invention the data is available two cycles after a control signal is asserted and a three stage pipeline model is used.

State Machine

Figure 5:
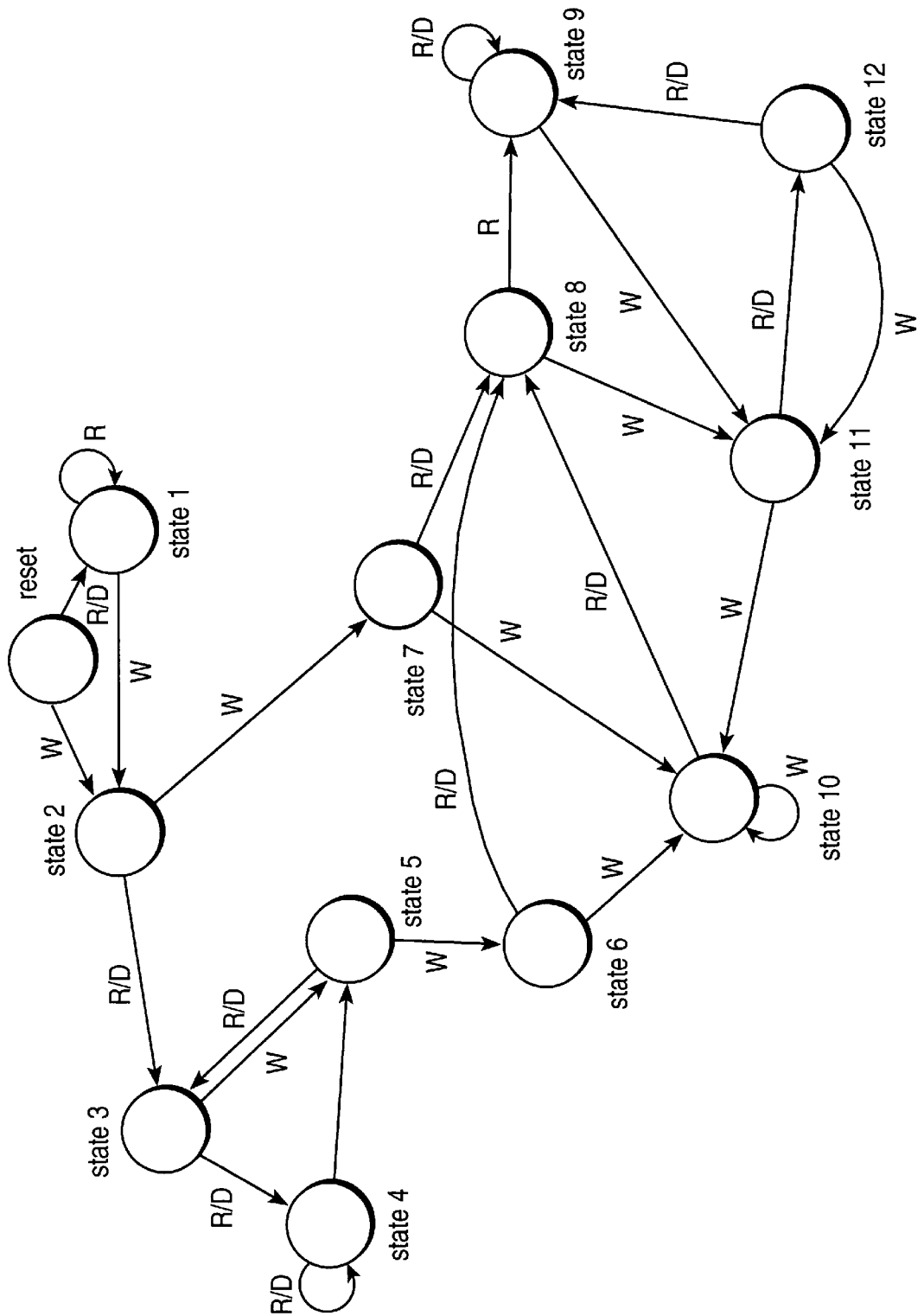
FIG. 5 is a state machine diagram for a flexible memory controller.

FIG. 5 illustrates a state machine diagram of one embodiment of the present invention. The state machine describes the different states that the memory device 210 can be in. A pseudo code listing comprising the control signals that perform the operations indicated in the state diagram is included at the end of this section. There are thirteen states shown in FIG. 5, twelve numbered states and reset. In this embodiment there are actually sixteen states because four bits are used to define the state. The remaining three states are defined to be equivalent to the reset state to ensure that the device is not inadvertently placed into an undefined state. As described above, there are three different cycle operations write, read and deselect. These operations are performed using a series of internal control signals. These control signals are represented by variable names in the pseudo code. Each control signal may in turn be comprised of several data transfer operations within the components of the device. For example transferring data from one address register to another, or reading an address from the address lines into an address register. For simplicity of presentation the description of the state machine below focuses on the basic register operations associated with each state. The description of the states does not include every signal in the device to avoid undue complexity. For example, with each read control signal the read address is loaded into address register 0. Similarly, with each write control signal the write address is loaded into address register 0. In the following description these steps are implicit in each description of a read or write signal being asserted.

Each cycle is either a write, read or deselect cycle. A deselect cycle is comprised of a no-operation (no-op) state. During a no-op state there is no access to the memory array. Internal register tasks may be performed during a no-op state. The following description defines the type of cycle as well as how many write operations are pending and the data that is available.

The arrows between the states in FIG. 5 indicate the state that the device will go to depending on the control signals received at the clock signal. An arrow with an "R/D" label indicates the state the machine will go to when it receives a read or deselect control signal. An arrow with a "W" label indicates the state the machine will advance to when it receives a write control signal.

The initial state of the device when the device is powered up is the Reset state. The Reset state is a no-operation state, the device is idle waiting for a control signal to indicate what operation is to be performed in the next cycle. If in the following cycle the control signal R/W bar, illustrated in FIG. 2, is low this indicates the cycle is a write cycle and the machine advances to State 2. If the control signal is high this indicates a read or deselect cycle and the machine advances to State 1. In the Reset state there are no write operations pending.

In State 1, if a read operation was requested then the memory array is accessed to read the contents of the memory array at the specified address. If a deselect was requested then no operation is performed. In State 1, a read or deselect request causes the machine to return to the start of State 1 and repeat the State 1 process. In State 1 there are no write operations pending. If a write request is received in State 1 then the machine advances to State 2.

In State 2 there is one write operation pending, originating from either State 0 or State 1. State 2 is a no-op state. No write operation is done in this cycle because the data associated with the pending write operation has not arrived at the memory device yet. The address stored in address register 0 is transferred to address register 1. The byte defined in byte write register 0 is transferred to byte write register 1. Transferring this address information stores this information for the pending write operation so that it is available when the write operation is completed. If the address information was not transferred then it could be written over by the address information loaded in the following cycle. In state 2 a read or deselect request advances the machine to State 3. A write request sends the machine to State 7.

At the start of State 3 there is one write operation pending and no data available. The address stored in address register 1 is compared with the word line, which defines the address in memory that is energized. If the addresses match then the data is taken from the data at the I/O pins. The word line is then defined to be the address register 0 address. If the address in address register 1 does not match the word line address then the data at the address register 0 address in the memory array is loaded into the output register. If a deselect was requested rather than a read operation then State 3 is a no-op state. After the read or no-op state, the machine loads the data on the I/O pins into data register 2. The address in address register 1 is loaded into address register 2, and the byte identifier in byte write register 1 is loaded into byte write register 2. If in State 3 the next control signal is a write signal then the machine advances to State 5. If in State 3 the next control signal is a read or deselect request then the machine advances to State 4.

At the start of State 4 there is one write pending and one data item stored. If the machine arrives at State 4 from a read control signal then the word line address is compared with the address in address register 2. If the addresses match then the data in data register 2 is loaded into the output register. The word line is then defined to be the address register 0 address. If the word line address does not match the address register 2 address then the data at the address register 0 address is read into the output register. If the machine arrives at State 4 based on a deselect request then State 4 is a no-op state. If in State 4 the next control signal is a write request then the machine advances to State 5. If in State 4 the next control signal is a read or deselect request then the machine repeats the process of State 4.

State 5 is a write cycle. The data that arrived in an earlier cycle is now written to the memory array at the address stored in address register 2. The address stored in address register 0 is then loaded into address register 1, and the byte identifier stored in byte write register 0 is loaded into byte write register 1. In State 5 after the actual write operation the status is one write pending and one data item stored. If in State 5 the next control signal is a write request then the machine advances to State 6. If in State 5 the next control signal is a read or deselect request then the machine advances to State 3.

State 6 is a no-op state. At the start of State 6 there are two write operations pending with no data items available. The address stored in address register 0 is loaded into address register 1 and the byte identifier stored in byte write register 0 is loaded into byte write register 1. The address stored in address register 1 is then loaded into address register 2, and the byte identifier in byte write register 1 is loaded into byte write register 2. After these register operations, the data from the I/O pins is loaded into data register 2. If in State 6 the next control signal is a write signal then the machine advances to State 10. If in State 6 the next control signal is a read or deselect signal then the machine advances to State 8.

State 7 is a no-op state. The machine enters State 7 when a write control signal is received in State 2. The status at the start of State 7 is two writes pending with no data available.

The first operation in State 7 is to load the address stored in address register 0 into address register 1 and to load the byte identifier in byte write register 0 into byte register 1. Then the address in address register 1 is loaded into address register 2 and the byte identifier in byte write register 1 is loaded into byte write register 2. After these operations, the data from the I/O pins is loaded into data register 2. If in State 7 the next control signal is a write signal then the machine advances to State 10. If in State 7 the next control signal is a read or deselect signal then the machine advances to State 8.

State 8 is a read or deselect state. The status in State 8 is two writes pending with one data item stored. If the machine arrives at State 8 based on a read control signal then the word line address is compared with the address in address register 1. If the addresses match then the data at the I/O pins is loaded into the output register. If the address in address register 2 matches the word line address then the data is loaded from data register 2 to the output register. The word line is then assigned the address in address register 0. If neither the address register 1 address nor the address register 2 address matched the word line address then the data at the address defined by address register 0 is read from the memory array and loaded into the output register. If the machine arrived at State 8 due to a no-op signal then State 8 is a no-op state. After the read or no-op state the data at the I/O pins is loaded into data register 1. If in State 8 the next control signal is a write signal then the machine advances to State 11. If in State 8 the next control signal is a read or deselect signal then the machine advances to State 9.

In State 9 there are two write operations pending and two data items stored. If the machine arrives at State 9 based on a read signal and not a deselect signal then the word line address is compared with the address register 1 address. If the addresses match then data is read from data register 1 and loaded into the output register. The word line address is then compared with the address register 2 address. If the addresses match then data is read from data register 2 and loaded into the output register. Next the word line address is defined to be the address register 0 address. If neither the address register 1 address nor the address register 2 address matched the word line address, then the data at the address register 0 address is loaded from the memory array into the output register. If the machine arrives at State 9 due to a no-op signal then State 9 is a no-op state. In State 9 if the next control signal is a write signal then the machine advances to State 11. In State 9 if the next control signal is a read or deselect signal then the machine repeats the State 9 process.

State 10 can follow States 6, 7 or 11. State 10 is a write cycle. The word line address is defined to be the address register 2 address. The data is written to the bytes in that address defined by the byte write registers. The address in address register 0 is loaded into address register 1. The byte identifier in byte write register 0 is loaded into byte write register 1. Then the address in address register 1 is loaded into address register 2, and the byte identifier in byte write register 1 is loaded into byte write register 2. Next the data from the I/O pins is loaded into data register 2. The status in State 10 after the write operation is two write operations pending one data item stored. In State 10 if the next control signal is a read or deselect signal then the state advances to State 8. Alternatively, if in State 10, the next control signal is a write signal then the State 10 process is repeated.

State 11 can follow States 8, 9 or 12. State 11 is a write cycle. The word line address is defined to be the address register 2 address. The data is written to the bytes in that address defined by the byte write registers. As in State 10, the address in address register 0 is loaded into address register 1. The byte identifier in byte write register 0 is loaded into byte write register 1. Then the address in address register 1 is loaded into address register 2, and the byte identifier in byte write register 1 is loaded into byte write register 2. Next, the data in data register 2 is loaded into data register 1. The status in State 11 after the write operation is two writes pending one data item stored. In State 11 if the next control signal is a write signal then the machine advances to State 10. Alternatively if in State 11 the next control signal is a read or deselect signal then the machine advances to State 12.

State 12 follows State 11. The status in State 12 is two writes pending one data item stored. If the machine arrives at State 12 due to a deselect signal then State 12 is a no-op state. Alternatively, if the machine arrives at State 12 due to a read signal then the word line address is compared to the address register 1 address. If the addresses match then data is read from the I/O pins and loaded into the output register. Next the word line address is compared to the address register 2 address. If the addresses match then data is read from data register 2 and loaded into the output register. The word line is then defined to be the address stored in address register 0. If neither the address register 1 address nor the address register 2 address matched the word line address, then the data at the address register 0 address is loaded from the memory array into the output register. After either the read operation or the no-op state, the data from the I/O pins is loaded into data register 1. In State 12 if the next control signal is a write signal then the machine advances to State 11. Alternatively if in State 12 the next control signal is a read or deselect signal then the machine advances to State 9.

These thirteen states define a state machine that allows two write operations to be pending and provides a state machine that can process any combination of read, write and deselect signals. Thus in contrast to conventional ZBT memory controllers that require read and write signals to be in one of four patterns, RW, RRWW, RRRWWW, or RRRRWWWW, the present invention can process an infinite combination of read, write and deselect signals. Such as, for example, thirty reads, followed by twenty writes, followed by one deselect. The thirteen states form a closed loop system. The state machine can be started in any of the thirteen states.

A pseudo code description of this embodiment of the state machine is provided below. In this pseudo code listing the "read1d" signal is the read signal delayed by one flip flop, as indicated by the "1d" suffix. The "actual_rd" signal indicates a read signal is actually a read operation and not a deselect operation. When "actual_rd" is asserted the word line is defined to be the address register 0 address. Similarly, when "actual_wrt" is asserted the word line is defined to be the address register 2 address. The "Id_dreg1" signal loads data from the I/O pins to data register 1. The "Id_dreg2"

signal loads data from the I/O pins to data register 2. The "acmp1_d1" signal compares the word line address with the address in address register 1 and if the addresses match takes data from data register 1. Similarly, "acmp2_d2" compares the word line address with the address in address register 2 and if the addresses match takes the data from data register 2. The "acmp1_idata" signal compares the word line address with the address register 1 address and if true takes data from the I/O pins. The "Id_a_bwreg1" signal loads the address from address register 0 into address register 1 and loads the byte identifier from byte write register 0 into byte write register 1. Similarly, "Id_a_bwreg2" loads the address register 1 address into address register 2 and loads the byte identifier in byte write register 1 into byte write register 2. Lastly the "shift_d1d2" signal loads the data in data register 1 into data register 2. These signals are all signals internal to the memory controller.

The following pseudo code describes the register level operation of the state machine illustrated in FIG. 5:

```
RESET :    begin
               noop
               //define next state
               if (wrtcyc)
                   sram_state_next = STATE2;
               else
                   sram_state_next = STATE1;
end
STATE1:    begin
               if(rdd1d)
               begin
                   actual_rd;
               end
               else
               begin
                   noop;
               end
               //control for next cycle
               // define next state
               if (wrtcyc)
                   sram_state_next = STATE2;
               else
                   sram_state_next = STATE1;
                   //sram_state_next = STATE1;
end
STATE2:    begin       //noop
               noop;
               //control for next cycle
               1d_a_bwreg1; //load addreg0 to addreg1
               if (wrtcyc)
                   sram_state_next STATE7;
               else
                   sram_state_next = STATE3;
end
STATE3:    begin       //rd @ addreg0 or Noop
               if (rdd1d)
               begin
                   acmp1_idata;
                   actual_rd;
               end
               else
               begin
                   noop;
               end
               // control for next cycle
               Id_dreg2;
               Id_a_bwreg2;
               if (wrtcyc)
                   sram_state_next = STATE5;
               else
                   sram_state_next = STATE4;
               end
STATE4:    begin       //rd @ addreg0 or Noop, add_cmp
```

-continued

```
               areg1
               if(rdd1d)
               begin
                   acmp2_d2;
                   actual_rd;
               end
               else
               begin
                   noop;
               end
               // control for next cycle
               // define next state
               if (wrtcyc)
                   sram_state_next = STATE5;
               else
                   sram_state_next = STATE4;
end
STATE5:    begin       // wrt @ addreg1 w/ dreg1 data
               actual_wrt;
               // control for next cycle
               1d_a_bwreg1;
               if (wrtcyc)
                   sram_state_next = STATE6;
               else
                   sram_state_next = STATE3;
end
STATE6:    begin
               noop;
               // control for next cycle
               1d_a_bwreg1;
               1d_a_bwreg2;
               1d_dreg2;
               if (wrtcyc)
                   sram_state_next = STATEA;
               else
                   sram_state_next = STATE8;
end
STATE7:    begin
               noop;
               // control for next cycle
               1d_a_bwreg1;
               1d_a_bwreg2;
               1d_dreg2;
               if (wrtcyc)
                   sram_state_next = STATEA;
               else
                   sram_state_next = STATE8;
end
STATE8:    begin       // read @ areg0 or Noop, acmp2
               if (rdd1d)
               begin
                   acmp1_idata;
                   acmp2_d2;
                   actual_rd;
               end
               else
               begin
                   noop;
               end
               // control for next cycle
               1d_dreg1;
               if (wrtcyc)
                   sram_state_next = STATEB;
               else
                   sram_state_next = STATE9;
end
STATE9:    begin       // read @ areg0 or Noop, acmp2
               if (rdd1d)
               begin
                   acmp1_d1;
                   acmp2_d2;
                   actual_rd;
               end
               else
               begin
                   noop;
               end
               // control for next cycle
               if (wrtcyc)
                   sram_state_next STATEB;
```

-continued

```
            else
                    sram_state_next = STATE9;
end
STATEA:     begin     // wrt @ areg2 w/ dreg2
            actual_wrt;
            // control for next cycle
            1d_a_bwreg1;
            1d_a_bwreg2;
            1d_dreg2;
            if (wrtcyc)
                    sram_state_next = STATEA;
            else
                    sram_state_next = STATE_C;
end
STATEB:     begin     // wrt @ areg2 w/ dreg2
            actual_wrt;
            // control for next cycle
            1d_a_bwreg1;
            1d_a_bwreg2;
            shift_d1d2;
            if (wrtcyc)
                    sram_state_next = STATEA;
            else
                    sram_state_next = STATE_C;
end
STATE_C:    begin     // read @ areg0 or Noop, acmp2
            if (rdd1d)
            begin
                    acmp1_idata;
                    acmp2_d2;
                    actual_rd;
            end
            else
            begin
                    noop;
            end
            // control for next cycle
            1d_dreg1;
            if (wrtcyc)
                    sram_state_next = STATEB;
            else
                    sram_state_next = STATE9;
end
(STATED || STATEE |||| STATEF): begin
            noop;
            // define next state
            if (wrtcyc)
                    sram_state_next = STATE2;
            else
                    sram_state_next = STATE1;
end
```

The present invention flexible memory interface controller can be implemented in numerous alternative embodiments. Additional hardware can be added to the controller, for example, additional data and address registers can be added to increase the number of pending memory access operations that can be stored. Such additions can provide additional stages in the pipeline model of the controller. The number of states in the state machine can also be changed. The present invention memory controller can further be applied to other types of memory including DRAM.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A memory device comprising:
   a memory array;
   a controller, coupled to the memory array, including pipeline circuitry for storing a sequence of at least three pending memory operations, wherein the at least three pending memory operations can include any sequence of read, write, and deselect operations; wherein the pipeline circuitry includes read operation processing circuitry that, when the pipeline circuitry stores a read operation and a write operation having identical addresses, and the read operation is later in the sequence than the write operation, processes the read operation by accessing data stored in the pipeline circuitry for the write operation instead of accessing data in the memory array.

2. The device of claim 1 wherein the memory device is a zero bus turnaround SRAM, wherein the zero bus turnaround SRAM performs write and read operations without an idle cycle between the read operation and the write operation when switching from the read operation to the write operation and when switching from the write operation to the read operation.

3. The device of claim 2 wherein the controller comprises:
   a first address register;
   a second address register coupled to the first address register;
   a third address register coupled to the second address register;
   a memory array;
   a first data register coupled to the memory array;
   a second data register coupled to the first data register;
   a first comparator coupled to the first, second and third address registers;
   a second comparator coupled to the first, second and third address registers.

4. The device of claim 1 wherein the controller has storage circuitry for storing two pending write operations.

5. The device of claim 4 wherein the controller further comprises:
   pipeline circuitry for performing a read operation while storing the two pending write operations;
   pipeline circuitry for performing a write operation while storing the two pending write operations.

6. The device of claim 5 wherein the memory device is an SRAM.

7. The device of claim 6 wherein the SRAM is a zero bus turnaround SRAM, wherein the zero bus turnaround SRAM performs write and read operations without an idle cycle between the read operation and the write operation when switching from the read operation to the write operation and when switching from the write operation to the read operation.

8. The device of claim 7 wherein the controller comprises:
   a first address register;
   a second address register coupled to the first address register;
   a third address register coupled to the second address register;
   a memory array;
   a first data register coupled to the memory array;
   a second data register coupled to the first data register;
   a first comparator coupled to the first, second and third address registers;
   a second comparator coupled to the first, second and third address registers.

9. A memory device comprising
a first address register;
a second address register coupled to the first address register;
a third address register coupled to the second address register;
a memory array coupled to the third address register;
a first data register coupled to the memory array;
a second data register coupled to the first data register;
a first comparator coupled to the first, second and third address registers;
a second comparator coupled to the first, second and third address registers;
wherein addresses are moved between the first, second and third address registers, and data is stored in the first and second data registers in a manner so that the memory device can perform any sequence of write, read and deselect operations.

10. The device of claim 9 wherein the memory device can store two pending write operations.

11. The device of claim 10 wherein the memory device is an SRAM.

12. The device of claim 11 wherein the SRAM is a zero bus turnaround SRAM, wherein the zero bus turnaround SRAM performs write and read operations without an idle cycle between the read operation and the write operation when switching from the read operation to the write operation and when switching from the write operation to the read operation.

13. A method of controlling a memory device comprising the steps of:
receiving a first control signal, if the first control signal is a read signal or a deselect signal then going to a first state, and if the first control signal is a write signal then going to a second state;
in the first state, receiving a second control signal, if the second control signal is a read signal or a deselect signal then returning to the first state, and if the second control signal is a write signal then going to the second state;
in the second state, receiving a third control signal, if the third control signal is a read signal or a deselect signal then going to a third state, and if the third control signal is a write signal then going to a seventh state;
in the third state, receiving a fourth control signal, if the fourth control signal is a read signal or a deselect signal then going to a fourth state, and if the fourth control signal is a write signal then going to a fifth state;
in the fourth state, receiving a fifth control signal, if the fifth control signal is a read signal or a deselect signal then returning to the fourth state, and if the fifth control signal is a write signal then going to the fifth state;
in the fifth state, receiving a sixth control signal, if the sixth control signal is a read signal or a deselect signal then going to the third state, and if the sixth control signal is a write signal then going to a sixth state;
in the sixth state, receiving a seventh control signal, if the seventh control signal is a read signal or a deselect signal then going to an eighth state, and if the seventh control signal is a write signal then going to a tenth state;
in the seventh state, receiving an eighth control signal, if the eighth control signal is a read signal or a deselect signal then going to an eighth state, and if the eighth control signal is a write signal then going to the tenth state;
in the eighth state, receiving a ninth control signal, if the ninth control signal is a read signal or a deselect signal then going to a ninth state, and if the ninth control signal is a write signal then going to an eleventh state;
in the ninth state, receiving a tenth control signal, if the tenth control signal is a read signal or a deselect signal then returning to the ninth state, and if the tenth control signal is a write signal then going to the eleventh state;
in the tenth state, receiving an eleventh control signal, if the eleventh control signal is a read signal or a deselect signal then going to the eighth state, and if the eleventh control signal is a write signal then returning to the tenth state;
in the eleventh state, receiving a twelfth control signal, if the twelfth control signal is a read signal or a deselect signal then going to a twelfth state, and if the twelfth control signal is a write signal then going to the tenth state;
in the twelfth state, receiving a thirteenth control signal, if the thirteenth control signal is a read signal or a deselect signal then going to the ninth state, and if the thirteenth control signal is a write signal then going to the eleventh state;
wherein the twelve states enable the memory device to perform any sequence of write, read and deselect operations.

14. The method of claim 13 wherein the twelve states enable the memory device to store two pending write operations.

15. The method of claim 14 wherein the memory device is an SRAM.

16. The method of claim 15 wherein the memory device is a zero bus turnaround SRAM, wherein the zero bus turnaround SRAM performs write and read operations without an idle cycle between the read operation and the write operation when switching from the read operation to the write operation and when switching from the write operation to the read operation.

17. A method of controlling a memory device comprising the steps of:
storing a sequence of at least three pending memory operations in a pipeline, the sequence of pending memory operations including a read operation and a write operation having identical addresses, wherein the read operation is later in the sequence than the write operation; and
processing the read operation by accessing data stored in the pipeline for the write operation instead of accessing data in a memory array.

18. The memory device of claim 1, wherein the pipeline circuitry includes a state machine that includes first, second, third, fourth, fifth, sixth, seventh, eighth, ninth, tenth, eleventh and twelfth states, wherein:
the state machine enters the first state when a first control signal is a read signal or a deselect signal;
when in the first state, the state machine receives a second control signal, the state machine returns to the first state if the second control signal is a read signal or a deselect signal, and the state machine goes to a second state if the second control signal is a write signal;
when in the second state, the state machine receives a third control signal, the state machine goes to a third state if the third control signal is a read signal or a deselect, and the state machine goes to a seventh state if the third control signal is a write signal;

when in the third state, the state machine receives a fourth control signal, the state machine goes to a fourth state if the fourth control signal is a read signal or a deselect signal, and the state machine goes to a fifth state if the fourth control signal is a write signal;

when in the fourth state, the state machine receives a fifth control signal, the state machine returns to the fourth state if the fifth control signal is a read signal or a deselect signal, and the state machine goes to the fifth state if the fifth control signal is a write signal;

when in the fifth state, the state machine receives a sixth control signal, the state machine goes to the third state if the sixth control signal is a read signal or a deselect signal, and the state machine goes to a sixth state if the sixth control signal is a write signal;

when in the sixth state, the state machine receives a seventh control signal, the state machine goes to the eighth state if the seventh control signal is a read signal or a deselect signal, and the state machine goes to a tenth state if the seventh control signal is a write signal;

when in the seventh state, the state machine receives an eighth control signal, the state machine goes to an eighth state if the eighth control signal is a read signal or a deselect signal, and the state machine goes the tenth state if the eighth control signal is a write signal;

when in the eighth state, the state machine receives a ninth control signal, the state machine goes to a ninth state if the ninth control signal is a read signal or a deselect signal, and the state machine goes to an eleventh state if the ninth control signal is a write signal;

when in the ninth state, the state machine receives a tenth control signal, the state machine returns to the ninth state if the tenth control signal is a read signal or a deselect signal, and the state machine goes to the eleventh state if the tenth control signal is a write signal;

when in the tenth state, the state machine receives an eleventh control signal, the state machine goes to the eighth state if the eleventh control signal is a read signal or a deselect signal, and the state machine goes to the tenth state if the eleventh control signal is a write signal;

when in the eleventh state, the state machine receives a twelfth control signal, the state machine goes to a twelfth state if the twelfth control signal is a read signal or a deselect signal, and the state machine goes to the tenth state if the twelfth control signal is a write signal;

when in the twelfth state, the state machine receives a thirteenth control signal, the state machine goes to the ninth state if the thirteenth control signal is a read signal or a deselect signal, and the state machine goes to the eleventh state if the thirteenth control signal is a write signal;

wherein the twelve states enable the memory device to perform any sequence of write, read and deselect operations.

\* \* \* \* \*